United States Patent [19]  [11] Patent Number: 4,735,921
Soukiassian  [45] Date of Patent: Apr. 5, 1988

[54] NITRIDATION OF SILICON AND OTHER SEMICONDUCTORS USING ALKALI METAL CATALYSTS

[76] Inventor: Patrick Soukiassian, Institute Universitaire de Technologie, Universite de Reims-Champagne-Ardenne BP396, 10026 Troyes Cedex, France

[21] Appl. No.: 55,738

[22] Filed: May 29, 1987

[51] Int. Cl.$^4$ .......................................... H01L 21/363
[52] U.S. Cl. .................................. 437/235; 437/237; 437/242; 437/920; 423/344; 427/255.4; 148/DIG. 16
[58] Field of Search ............... 437/235, 237, 239, 242, 437/920; 423/344; 427/255.4

[56] References Cited

U.S. PATENT DOCUMENTS 4,526,629 7/1985 Latta et al. ......................... 437/239

OTHER PUBLICATIONS

Koval et al., "Ionization Spectroscopy of Silicon Oxides Formed in Cs-O Films Adsorbed on the (100) Foce of Si", Sov. Phys. Solid State, 23 (10), Oct. 1978, pp. 1769-1770.
Bonzel, "Alkali-promoted Gas Adsorption and Surface Reactions on Metals", J. Vac. Sci. Technol. A 2(2), Apr.-Jun. 1984, pp. 866-14 872.
Katnani et al., "Modification of the Germanium Oxidation Process by Aluminum Adatons", Apd. Phys. Lett., 40(7), Apr. 1, 1982, pp. 619-621.
Surnev et al., "Adsorption . . . on Germanium (111) Surfaces Covered with Potassium and Cesium", Surf. Sci. 85 (1979), pp. 413-431.
Clemens et al., "On the Interaction of Cesium with Cleaved GaAs(110) and Ge(111) Surfaces: . . .", Surf. Sci. 78 (1978), pp. 648-666.
J. A. Taylor, et al., "Interactions of Jon Beams with Surfaces. Reactions of Nitrogen with Silicon and its Oxides," J. Chem. Phys., vol. 68, No. 4, Feb. 15, 1978, pp. 1776-1784.

A. G. Schrott, et al., "Nitridation of Si (111) by Nitrogen Atoms", Surface Science 111 (1981) pp. 39-52.
T. Isu et al., "Ultraviolet Photoemission Spectroscopy of $NH_3$ and NO on Si (111) Surfaces," Solid State Communications, vol. 42, No. 6, 1982, pp. 477-479.
F. H. P. M. Habraken, et al., "Thermal Nitridation of Silicon Dioxide Films," J. Appl. Phys. 53(10), Oct., 1982, pp. 6996-7002.
C. Maillot, et al., "Thermal Nitridation of Silicon: An XPS and LEED Investigation," J. Vac. Sci. Technol. B. 2(3), Jul.-Sep. 1984, pp. 710-713.
L. Ley et al., "Localized States at the Conduction--Band Edge of Amorphous Silicon Nitride Detected by Resonance Photoemission." Physical Review Letters, vol. 53, No. 7, Aug. 13, 1984, pp. 710-713.

(List continued on next page.)

Primary Examiner—Brian E. Hearn
Assistant Examiner—William Bunch
Attorney, Agent, or Firm—Isaksen, Lathrop, Esch, Hart & Clark

[57] ABSTRACT

Nitride layers are formed on semiconductor substrates utilizing alkali metals as catalysts. The surface of the semiconductor substrate first has a thin layer of an alkali metal deposited thereon and then is exposed to nitrogen from a nitrogen source at temperatures and pressures sufficient to grow a nitride layer, which will generally occur at lower temperatures than required for nitride formation by conventional processes. The surface is then annealed and the catalyst removed by heating at moderate temperatures, desorbing the catalyst and leaving a nitride layer on the surface of the substrate which is uncontaminated by the alkali metal catalyst. The process is particularly suited to the formation of nitride layers on silicon utilizing essentially a monolayer of the alkali metal such as sodium. After formation of the nitride, heating of the substrate drives off essentially all of the catalyst at temperatures sufficiently low that the silicon substrate is not impaired for further processing steps, such as the formation of microelectronic devices.

23 Claims, 6 Drawing Sheets

OTHER PUBLICATIONS

L. J. Whitman, et al., "Alkali-Metal Promotion of a Dissociation Precursor: $N_2$ on Fe (111)," Physical Review Letters, vol. 56, No. 18, May 5, 1986, pp. 1984–1987.

R. Karcher, et al., "Electronic Structure of Hydrogenated and Unhydrogenated Amorphous $SiN_x$ ($0 \times 1.6$): A Photoemission Study," Physical Review B, vol. 30, No. 4, Aug. 15, 1984, pp. 1896–1910.

F. Bozso et al., "Reaction if Si (100) with $NH_3$: Rate-Limiting Steps and Reactivity Enhancement via Electronic Excitation," Physical Review Letters, vol. 57, No. 9, Sep. 1, 1986, pp. 1185–1188.

S. Cerrina, et al., "Synchrotron-Radiation Induced Nitridation of Silicon at Room Temperature." Appl. Phys. Lett. 50 (9), Mar. 2, 1987, pp. 533–534.

E. K. Hill, et al., "Photoemission Study of Ammonia Dissociation on Si (100) below 700 K," Physical Review B, vol. 35, No. 11, Apr. 15, 1987, pp. 5913–5916.

D. G. Kilday, et al., "High Resolution Electron Energy Loss Study of $NH_3$ adsorption on Si (111) $2 \times 1$ at Room Temperature," (In Press).

P. Soukiassian, et al., "$SiO_2$-Si Interface Formation by Catalytic Oxidation Using Alkali Metals and Removal of the Catalyst Species," J. Appl. Phys. 60 (12), Dec. 15, 1986, pp. 4339–4341.

A. Franciosi, et al., "Electronic Promoters and Semiconductor Oxidation: Alkali Metals on Silicon (111) Surfaces," Physical Review B. vol. 35, No. 2, Jan. 15, 1987, pp. 910–913.

P. Soukiassian, et al., "Exceptionally Large Enhancement of InP (110) Oxidation Rate by Cesium Catalyst," J. Appl. Phys. Mar. 1987.

P. Soukiassian, et al., "Catalytic Oxidation of Semiconductors by Alkali Metals," Physica Scripta, vol. 35, 1987 (In Press).

P. Soukiassian, et al., "Electronic Properties of $O_2$ on Cs or Na Overlayers Adsorbed on Si (100) $2 \times 1$ from Room Temperature to 650° C.", Physical Review B, vol. 35, No. 8, Mar. 15, 1987.

NITRIDATION OF SILICON AND OTHER SEMICONDUCTORS USING ALKALI METAL CATALYSTS

FIELD OF THE INVENTION

This invention pertains generally to the field of material processing techniques, such as semiconductor processing, and particularly to the formation of nitrides on semiconductors such as silicon.

BACKGROUND OF THE INVENTION

The nitridation of semiconductor surfaces is used in the manufacture of microelectronic devices for such purposes as providing a passivation layer and/or a thin film insulator. Effort has particularly been directed at processes for forming nitrides of silicon. Silicon nitrides, such as $Si_3N_4$, have been formed by processes such as ion implantation or exposure to excited nitrogen at a pressure around $10^{-4}$ Torr combined with thermal annealing at elevated temperatures. However, because of the general lack of reactivity of molecular nitrogen, most studies of silicon nitridation have been performed with the use of more reactive molecules containing nitrogen, such as $NH_3$ or NO. With ammonia used as the reactive nitrogen source, hydrogen atoms are typically left at the nitride-silicon interface. Furthermore, in many cases, nitridation is obtained only by assisting the process by the use of an electron beam scanned over the surface, by applying unmonochromatized synchrotron radiation "'white light" emitted by a storage ring to the surface, or by thermal annealing at a rather high temperature, e.g., 1000° C. or higher. However, it is found that in the process of forming the nitrides, all of these treatments generally damage the surface and create defects, making subsequent formation of electronic devices difficult or impossible.

It has been determined by applicant that alkali metals are a highly efficient promoter of semiconductor oxidation. Furthermore, it was demonstrated that the alkali metal catalysts are removable from the surface after catalytic oxidation. See P. Soukiassian, et al, "$SiO_2$-Si Interface Formation by Catalytic Oxidation Using Alkali Metals and Removal of the Catalyst Species," J. Appl. Phys. 60 (12), 15 December 1986, pp. 4339–4341. The catalytic effects of such alkali metals on silicon and other semiconductor substrates with respect to gases other than oxygen, and particularly nitrogen, has heretofore generally been unknown and unpredicted. In particular the nitrogen molecule ($N_2$) has a larger dissociation energy than oxygen. Furthermore, it is known that the nitrogen molecule does not stick well on semiconductor surfaces.

It is of great importance that any catalyst used, and alkali metals in particular, not remain at the surface or in the bulk of the silicon or other semiconductor substrate since the presence of the catalyst would render these semiconductors useless for the production of electronic devices. In addition, if high temperature heat treatment or ion bombardment is necessary to remove the catalyst, such treatment will damage the semiconductor surface and partially or totally destroy the usefulness of the semiconductor substrates for formation of microelectronic devices.

SUMMARY OF THE INVENTION

In accordance with the present invention, catalytic nitridation of the surfaces of semiconductor substrates is obtained by first forming a thin layer, preferably about a monolayer, of an alkali metal on the surface. The surface is then exposed to nitrogen from a source such as molecular nitrogen gas or other gas containing nitrogen at a temperature and exposure level sufficient to grow a layer. The nitride layer can be grown at temperatures, including room temperature, which are substantially lower than previously known for the nitridation of semiconductor materials, particularly silicon. After formation of the nitride layer to a desired thickness, the surface is annealed and the alkali catalyst removed by heating at a moderate temperature which is also substantially below the temperatures previously required to form nitrides on such semiconductor materials. The catalyst atoms are essentially completely removed from the nitride layer and do not go into the bulk of the substrate. Because only moderate temperatures are required to remove the catalyst, the semiconductor substrate is not significantly affected and remains in condition for the formation of microelectronic devices thereon.

Particularly good results are obtained utilizing alkali metal catalysts on silicon substrates, resulting in the formation of silicon nitride layers with the nitrogen supplied from molecular nitrogen gas ($N_2$) After annealing at moderate temperatures, in the range of 650° C. and lower, apparent total removal of the alkali metal catalyst is obtained. Sodium is found to be a particularly effective catalyst for the formation of silicon nitrides from a molecular nitrogen gas source without the need for assistance from such sources as synchrotron radiation. Other alkali metals may also be utilized as catalysts to obtain effective nitride formation. Other nitrogen sources such as ammonia ($NH_3$) gas may be used, and the catalytic formation of nitrides may be assisted by dissociating radiation such as synchrotron white light radiation.

After annealing at moderate temperatures, for example in the range of 650° C.–800° C. or less, apparent total desorption of the alkali metal catalyst from the surface is obtained and high silicon nitridation states such as $Si_3N_4$ are formed. A superior silicon nitride-silicon interface is thus obtained, with the thickness of the silicon nitride layer being controllable based on exposure time. The silicon nitride-silicon interface is of better quality than interfaces which may be obtained by conventional nitridation processes and is achieved at much lower temperatures. The process thus not only does not result in diffusion of the catalyst atoms into the bulk, but minimum diffusion of other impurities into the silicon bulk occurs because relatively low temperatures are utilized. The silicon surface and bulk thus suffer little or no damage and are left in a condition available for further semiconductor device processing.

Further objects, features, and advantages of the invention will be apparent from the following detailed description when taken in conjunction with the accompanying drawings.

DESCRIPTION OF THE PREFERRED EMBODIMENTS

Figure 2:
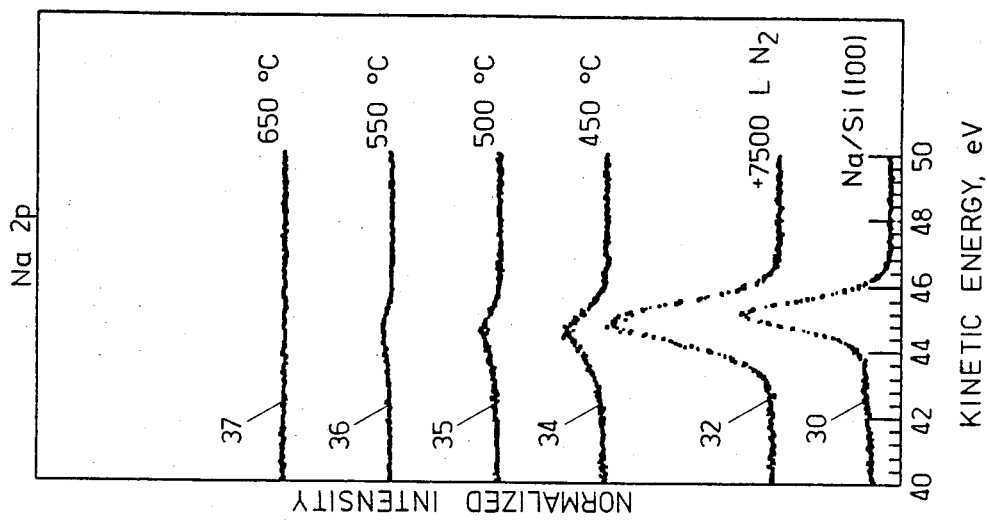
FIG. 2 is a composite of photoemission spectra using synchrotron radiation at an incident photon energy of 82 eV of the sodium 2p core level of the surface as in FIG. 1 before and after exposure to nitrogen and after heat treatment at various temperatures from room temperature to 650° C. The photoelectron intensity is normalized to the beam current.

In carrying out the process of the present invention, alkali metals are used as catalysts in the formation of nitride layers on semiconductor materials on which it has otherwise very difficult to form such nitride layers, or which heretofore required undesirably high temperature levels to enable the formation of nitrides. Formation of nitrides is significant in microelectronic semiconductor manufacturing which utilizes such substrates as polycrystalline and monocrystalline silicon, germanium, gallium arsenide, indium phosphide, and so forth. It is significant in accordance with the present invention to the processing of such semiconductors that substantially all, if not all, of the alkali metal catalyst is removed from the nitride layer by a heating step at temperatures which do not otherwise affect the semiconductor or impair its capacity to have circuit structures formed thereon.

In carrying out the invention, the surface of the semiconductor substrate is preferably first cleaned to remove any impurities which would otherwise affect the quality of the nitride-semiconductor interface and poison the catalytic reaction. A thin layer of alkali metal is then deposited on the surface. Generally, a monolayer of alkali metal is sufficient to provide the catalytic action, although the rate of reaction may be increased with the catalyst deposited to more than a monolayer thickness. Less than a monolayer may also be utilized. After the layer has been deposited on the surface, the surface is exposed to a nitrogen carrier gas source, such as molecular nitrogen ($N_2$), ammonia ($NH_3$) or other nitrogen containing molecules at temperatures and pressures which are sufficient to allow the nitride layer to grow. Because of the presence of the alkali catalyst, the nitride layer grows at faster rates, at lower nitrogen gas concentrations, and at lower temperatures than would otherwise be required to form nitride by conventional techniques if such nitride layers can be formed at all. After the nitride is grown to a desired depth, the nitrogen ambient is removed from the substrate and the substrate is heated, preferably by flash heating, to a temperature found sufficient to drive off the catalytic alkali metal by desorption and concurrently to anneal the surface layer of nitride. The temperature required to drive off the catalyst is below the normal processing temperatures that would otherwise be required to grow nitride layers in conventional processing, again avoiding the heating of the substrate to temperatures which would tend to affect the capacity of the substrate to accept further microelectronic structure processing steps. The fact that nitrides may be formed at temperatures and exposures lower than necessary to obtain nitride formation without the use of catalysts allows patterned nitride structures to be formed by laying the catalyst down in a pattern on the substrate. No significant nitride will form in the unpatterned areas where there is no catalyst.

The principles of the invention are exemplified by the following specific examples of the processing of the silicon substrate utilizing sodium, cesium, and potassium catalysts, and molecular nitrogen and ammonia gas sources. It is understood that the invention is not limited to the examples provided herein and may be applied utilizing various alkali metal catalysts to a variety of semiconductor substrates.

EXAMPLE 1

A crystalline silicon (100) (2×1) sample was mounted in an ultrahigh vacuum chamber with a base pressure of $5 \times 10^{-11}$ Torr and was cleaned by argon ion bombardment (500 eV, 20 mA). The sample was then annealed by electron bombardment at 1,000° C., with the temperature being monitored by an infrared pyrometer. The surface was then examined by Auger spectroscopy, and the argon ion bombardment treatment and annealing repeated until the surface appeared clean under Auger spectroscopy, that is, free from impurities such as carbon, oxygen, and so forth. The alkali metal overlayer may be deposited at any time after the sample cools down to room temperature, typically 10 minutes after annealing.

A sodium chromate source manufactured by SAES Getter was used for the deposition. The source was mounted in a housing which was attached to a linear feed-through so that the source could be brought to within about 2 centimeters of the silicon sample. Before being used, the source was carefully outgassed as follows. When the vacuum chamber obtained a base pressure at least in the low $10^{-10}$ Torr range, outgassing of the sodium source was started with a current at 2.8 amperes for 14 hours. The current was increased in steps of 200 mA when the base pressure returned to the low $10^{-10}$ Torr range after each increase in pressure from outgassing. The process was continued until the current reached 4.8 amperes. The source was then progressively outgassed at 5, 5.1, 5.2, and finally 5.3 amperes in a series of two minute evaporations. The source was considered to be perfectly outgassed when the pressure did not increase by more than $1 \times 10^{-10}$ Torr during two minutes at 5.3 amperes.

The source housing was then translated to 1 centimeter from the silicon sample and the sodium metal evaporated from the source by passing a 5.3 ampere current through the source for two minutes. This resulted in essentially a monolayer of sodium formed by a vapor deposit on the silicon surface.

Research grade molecular nitrogen gas (N$_2$) was then introduced into the chamber through a leak valve at ambient room temperature (about 22° C.). A nitrogen exposure at a level of 7,500 Langmuir was made on the silicon substrate prepared as discussed above.

Figure 1:
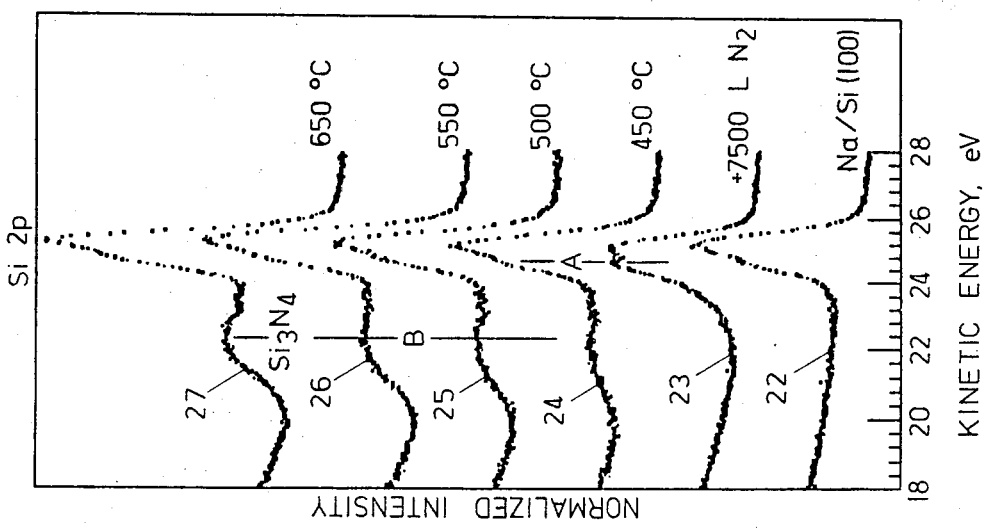
FIG. 1 is a composite of photoemission spectra using synchroton radiation and an incident photon energy of 130 eV of the silicon 2p core level of a silicon (100) surface with a monolayer of sodium deposited thereon, after exposure to 7,500 Langmuir of nitrogen gas ($N_2$), and after heat treatment at various temperature steps from room temperature to 650° C. The photoelectron intensity is normalized to the beam current.

The formation of the nitride layer on the silicon substrate was observed with photoemission spectroscopy using synchrotron radiation with the sample in an ultra high vacuum chamber at a pressure of $5 \times 10^{-11}$ Torr. The light emitted by a 1 giga-electron volt synchrotron storage ring was dispersed by a Grasshopper Mark II monochromator, and the photoelectron energy was analyzed by a double-pass cylindrical mirror analyzer. The overall resolution was set at 300 MeV for the valence band. The photoemission spectrum of the silicon 2p core level obtained after deposit of the sodium monolayer on the silicon is shown by the graph 20 in FIG. 1, illustrating the silicon 2p peak. The corresponding photoemission spectrum of the sodium 2p core level is shown in the graph 30 in FIG. 2 which has a characteristic sodium peak. The exposed surface was then subjected to several annealing cycles at temperatures between 450° C. and 650° C. It is seen that after exposure to 7,500 Langmuir of nitrogen, a new structure denoted at the line A was raised near the silicon 2p core level, but at 0.5 eV higher binding energy. This chemical shift is a consequence of the formation of Si-N bonds, which indicates the formation of low silicon nitridation states. It is also known that the direct exposure (without the use of a sodium catalyst) of the silicon (100) surface to 7,500 Langmuir of nitrogen does not result in any observable change in the silicon 2p core level.

When the silicon surface covered with the sodium layer and after exposure to nitrogen is annealed at 450° C., the peak A in the graph 22 is attenuated while a new broad peak B is raised at 2.6 to 2.8 eV higher binding energy than the silicon 2p level. This new chemical shift is related to the growth of a higher nitridation state such as Si$_3$N$_4$. The intensity of this peak increases after annealing at temperatures between 500° C. and 650° C., as illustrated in the graphs 24, 25, 26 and 27 in FIG. 1. This indicates an increase in the amount of nitride present on the surface. The thickness of the nitride layer was estimated to be about 8 Angstroms.

The sodium was removed and the nitride layer annealed by flash heating the sample with electron bombardment to the side of the sample opposite the nitride layer, performed in a chamber at high vacuum (about $5 \times 10^{-11}$ Torr) to allow the annealed sample to be examined by photoemission spectroscopy. The progressive change in the silicon core level with temperature is illustrated in the graphs 24–27 of FIG. 1 showing the effects of several quick annealing cycles at temperatures from 450° C. to 650° C. The graphs of FIG. 2 show the behavior of the sodium 2p core level over the same sequence. The graph 30 is for the initial sodium coated silicon sample, and the graph 32 is the sample after exposure to 7,500 Langmuir of molecular nitrogen. The exposure of the sodium coated silicon surface to the nitrogen resulted in a broadening by fifty percent of the sodium 2p core level, indicating that nitrogen also reacted with the adsorbate. The annealing of the surface at increasing temperatures from 450° C. to 650° C., shown by the graphs 34–37 in FIG. 2, show that the intensity of the sodium 2p level decreased rapidly and after the final annealing at 650° C. no emission from this level was observed, showing that no sodium remained on the surface. It is also seen that the decrease of the sodium 2p core level is linear between 450° C. and 550° C. If a diffusion of the sodium adsorbate occurred instead of desorption, this observed linear decrease would not be expected. In fact, with the exception of lithium, alkali metals do not interdiffuse through the silicon surface and do not form silicide.

Valence band studies indicate that sodium enhances the sticking coefficient of nitrogen and serves to dissociate the nitrogen molecule. Sodium also weakens the silicon back bonds. Consequently, the atomic nitrogen, dissociated by the alkali metal, reacts with the silicon atoms, which is thus believed to be the mechanism by which electronic nitridation is induced by the sodium present on the sodium surface.

These data demonstrate the catalytic role of sodium as an electronic promoter of silicon nitridation. Furthermore, the data also show that the catalyst can be removed from the surface by thermal desorption at moderate temperature. As a result of this catalytic nitridation, a clean, sodium-free Si$_3$N$_4$-Si interface is formed at a much lower temperature than normally necessary without the sodium catalyst. Typically, annealing at temperatures in the 1000° C. range are necessary to form similar nitride by direct interaction between nitrogen and silicon. The present process allows interaction between nitrogen and silicon without the use of electron beams, intense photon beams, thermal annealing at high temperatures and high nitrogen pressures, or ion bombardment. Of course, it is advantageous to avoid the need to use these processes since they may damage the surface.

EXAMPLE 2

Figure 3:
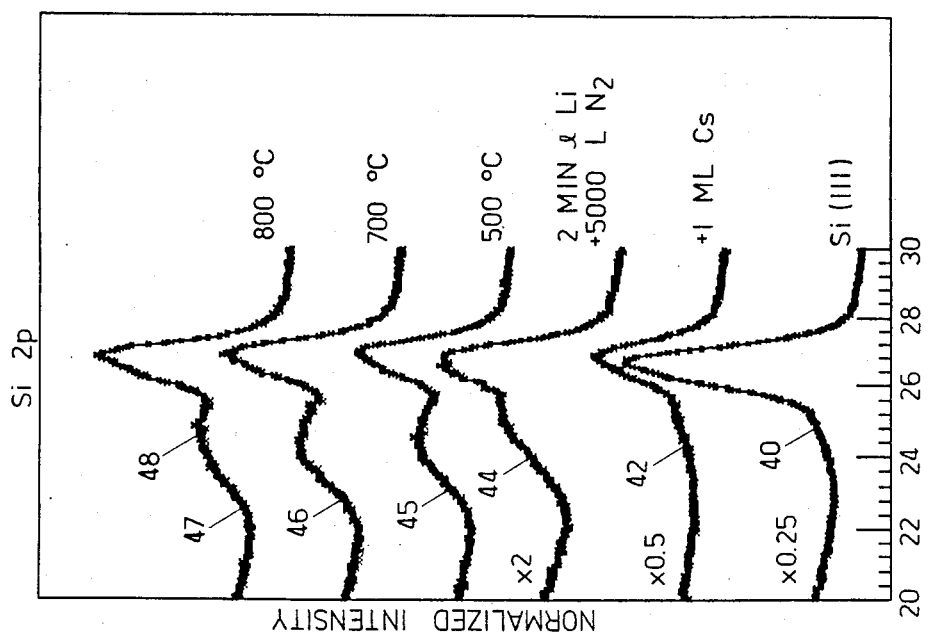
FIG. 3 is a composite of photoemission spectra using synchrotron radiation at an incident photon energy of 130 eV of the silicon 2p core level of a silicon (100) surface with a monolayer of cesium deposited thereon, after exposure to 5,000 Langmuir of nitrogen gas ($N_2$) and two minutes of white synchrotron light, and after heat treatment in various temperature steps to 800° C. The photoelectron intensity is normalized to the beam current.
Figure 6:
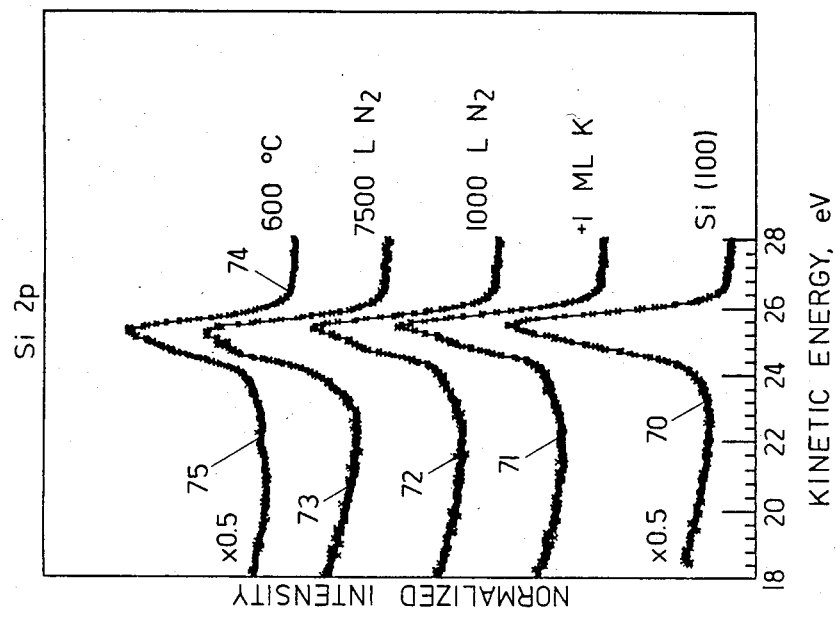
FIG. 6 is a composite of photoemission spectra using synchrotron radiation at an incident photon energy of 82 eV of the silicon 2p core level of the sample of FIG. 5.

A silicon (111) sample was nitrided using cesium as the catalyst. The sample was mounted in an ultra-high vacuum chamber and cleaned as described above in Example 1. A cesium chromate source was mounted and outgassed as described above for the sodium source. After outgassing, the source was brought to about 1 centimeter from the silicon sample and one monolayer of cesium was formed by deposition on the silicon substrate. A photoemission spectrum, obtained as described above, of the silicon 2p core level on the clean substrate is shown in FIG. 3 at 40, showing the silicon 2p peak, with the photoemission spectrum after application of the monolayer of cesium shown at 42 in FIG. 3. A substrate with a monolayer of cesium thereon was then exposed to 5,000 Langmuir of nitrogen gas at room temperature and to two minutes of synchrotron emitted unchromatized "white light", i.e., emissions having a photon energy over roughly the range from 0 to 2000 electron volts. The resulting photoemission spectrum of the sample so treated is shown at 44 in FIG. 3. The sample was then subjected to several quick annealing cycles by electron bombardment in high vacuum at increasing temperatures from 500° C. to 800° C. The resulting spectra of the sample at the various temperatures are shown in the graphs 45–47 in FIG. 3, evidencing a second peak which is slightly shifted from the first peak. This second peak, generally denoted at 48 on the graph 47, relates to the growth of higher nitridation states like $Si_3N_4$.

Figure 4:
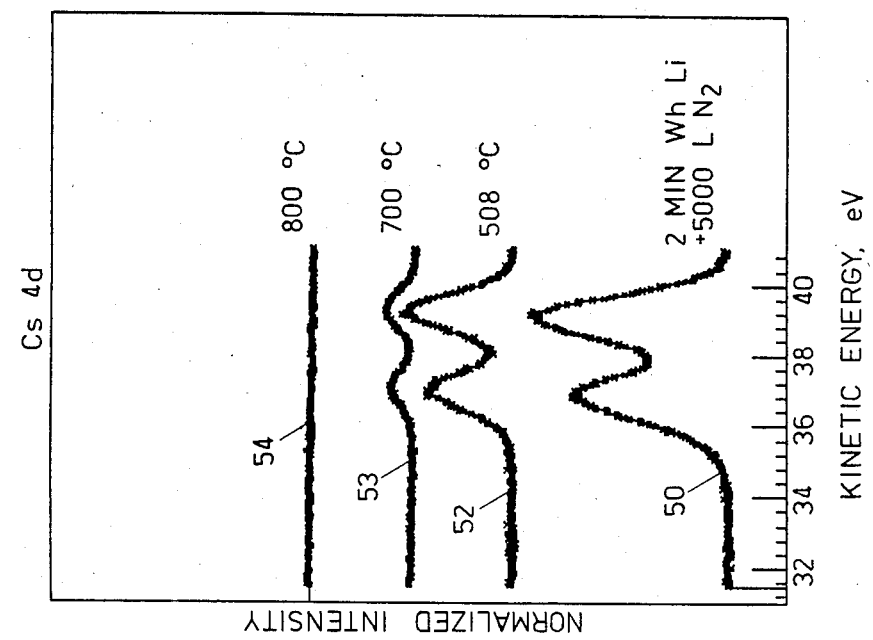
FIG. 4 is a composite of photoemission spectra using synchrotron radiation at an incident photon energy of 120 eV of the cesium 4d core level of the surface as in FIG. 3 after exposure to nitrogen gas and white synchrotron light and after heat treatment at various temperatures up to 800° C. The photoelectron intensity is normalized to the beam current.

The graphs of FIG. 4 show the photoemission spectra of the cesium 4d core levels as the substrate was heated to progressively higher temperatures. The graph 50 shows the spectrum obtained initially after exposure to 5,000 Langmuir of nitrogen gas and two minutes of unmonochromatized synchrotron radiation white light emitted by a storage ring. The graph 52 shows the spectrum obtained after heating at 508° C., the graph 53 after heating at 700° C., and the graph 54 after heating at 800° C. Each of the spectra shown in the graphs 50, 52 and 53 exhibit the characteristic cesium double peak. However, after heating to a temperature between 700° C. and 800° C., substantially no cesium remained on the sample. Generally, no detectable cesium atoms remained in either the nitride layer or the silicon bulk.

EXAMPLE 3

Figure 5:
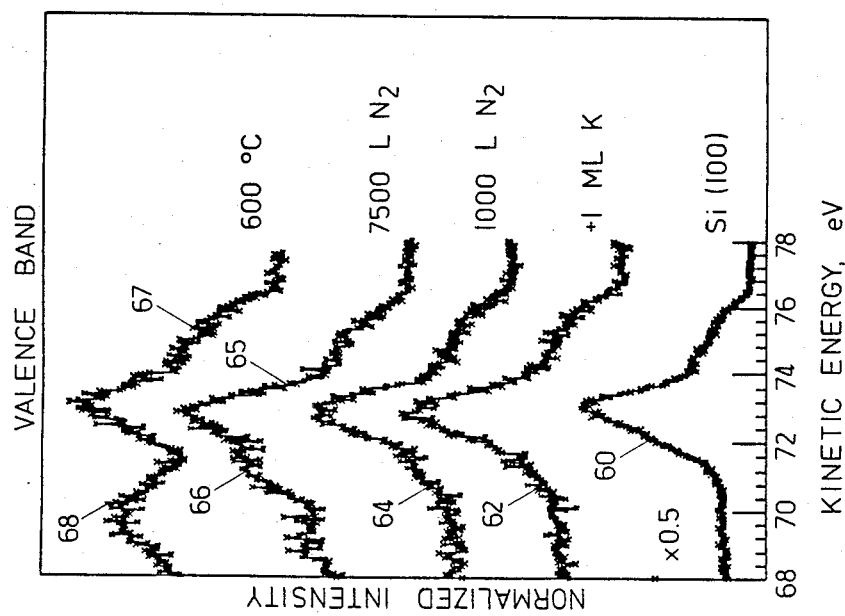
FIG. 5 is a composite of photoemission spectra using synchrotron radiation at an incident photon energy of 82 eV of the silicon valence band of a silicon (100) surface with a monolayer of potassium deposited thereon, after exposure to 1,000 Langmuir nitrogen gas ($N_2$), after exposure to 7,500 Langmuir of nitrogen gas, and after heat treatment at 600° C. The photoelectron intensity is normalized to the beam current.

A nitride layer was formed on another silicon (100) sample using potassium as the catalyst. The silicon sample was mounted in an ultra-high vacuum chamber and cleaned as described above in Example 1, and a potassium chromate source was mounted and outgassed as described above for the sodium source. After outgassing, the source was brought to about 1 centimeter from the silicon sample and one monolayer of potassium was formed by deposition on the silicon substrate. A photoemission spectrum of the silicon valence band before application of the potassium monolayer is shown at the graph 60 in FIG. 5, and a photoemission spectrum of the sample after application of the monolayer of potassium is shown in the graph 62 in FIG. 5. These two graphs illustrate the expected silicon peak. After exposure of the sample with the monolayer of potassium thereon to 1,000 Langmuir of nitrogen gas at room temperature, the sample exhibited the photoemission spectrum shown in the graph 64 in FIG. 5, which shows an incipient second peak. After exposing the sample to 7,500 Langmuir of nitrogen gas at room temperature, the photoemission spectrum shown in the graph 65 in FIG. 5 was obtained, which exhibits a distinct second peak 66. After heating the sample to 600° C., the photoemission spectrum 67 resulted which has a distinct second peak 68, displaced from the first peak and from the peak 66 in the graph 65, evidencing the formation of higher silicon nitridation states.

Figure 7:
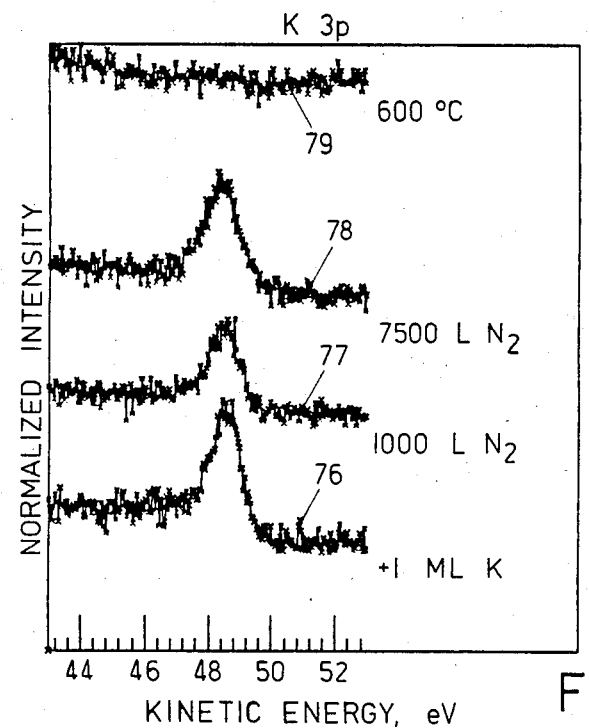
FIG. 7 is a composite of photoemission spectra using synchrotron radiation at an incident photon energy of 77 eV of the potassium 3p core level of the surface as in FIG. 5 before exposure to nitrogen, after exposure to nitrogen at 1,000 Langmuir, after exposure at 7,500 Langmuir, and after heat treatment at 600° C. The photoelectron intensity is normalized to the beam current.

The graphs 70–74 show the corresponding silicon 2p core levels. After heating to 600° C., a discernible separate peak 75 is evident, corresponding to higher silicon nitridation levels. The graphs of FIG. 7 show the corresponding photoemission spectra of the potassium 3p core levels. The graph 76 is of the initial substrate with one monolayer of potassium applied thereto. The graph 77 shows the photoemission spectrum of the substrate after exposure to 1,000 Langmuir of nitrogen and the graph 78 after exposure to 7,500 Langmuir of nitrogen. Each of these graphs show the distinct potassium 3p peak. After heating of the sample exposed to 7,500 Langmuir of nitrogen to 600° C., the photoemission spectrum is the graph 79, which shows no remaining potassium peak.

As the foregoing examples illustrate, it is possible to obtain nitride formation utilizing the alkali catalysts of the present invention with the nitrogen supplied from molecular nitrogen gas. However, it is also possible to obtain enhanced nitridation of substrates from nitrogen sources other than molecular nitrogen gas. A source of nitrogen presently used at present for nitride formation is ammonia gas ($NH_3$). The following examples illustrate the formation of nitrides utilizing ammonia as the nitrogen source.

EXAMPLE 4

Figure 8:
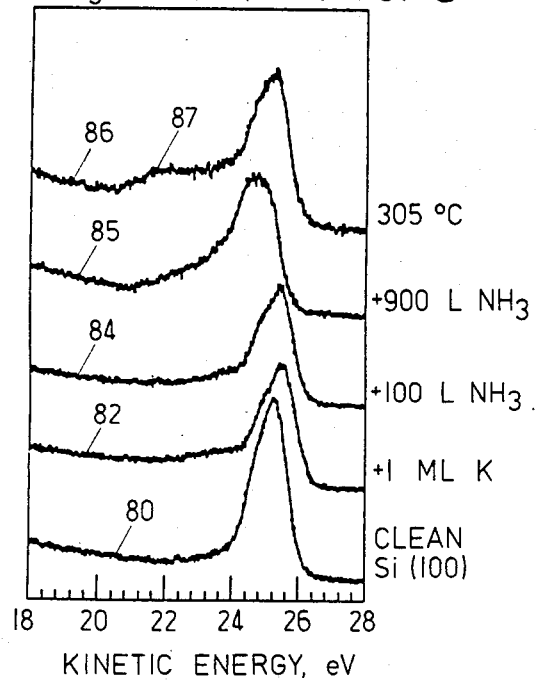
FIGS. 8 and 9 are composite photoemission spectra using synchrotron radiation at an incident photon energy of 130 eV of the silicon 2p core level of a silicon (100) surface, after a monolayer of potassium is deposited thereon, after exposure to 100 Langmuir ammonia gas ($NH_3$), after exposure to 900 Langmuir ammonia, and after heat treatment in various steps from 305° C. to 650° C.
Figure 9:
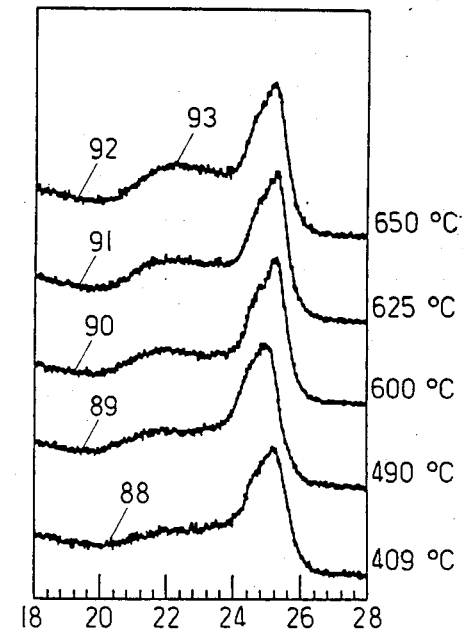

A silicon (100) sample had a nitride layer formed thereon using potassium as the catalyst and ammonia gas as the nitrogen source. The sample was mounted in an ultra-high vacuum chamber, cleaned, and then had a monolayer of potassium formed thereon as described above in Example 3. A photoemission spectrum of the silicon 2p core level of the clean sample is shown at 80 in FIG. 8 and a photoemission spectrum of the sample after formation of the monolayer of potassium is shown at 82 in FIG. 8. A spectrum obtained after the sample with the monolayer thereon was exposed to 100 Langmuir of ammonia is shown in FIG. 8 at 84, and a spectrum obtained after exposure to 900 Langmuir of ammonia gas is shown at 85. After heating the sample to 305° C. in the manner described above, the graph 86 is obtained which shows a second peak 87 displaced from the original silicon peak. Photoemission spectra obtained after heating the sample at increasing temperatures from 409° to 650° are shown at 88–92 in FIG. 9. At the highest temperature of 650° C., a distinct second peak 93 is seen in the spectrum (as well as in the spectra resulting from heating at lower temperatures), evidencing formation of higher nitridation states.

Figures 10, 11:
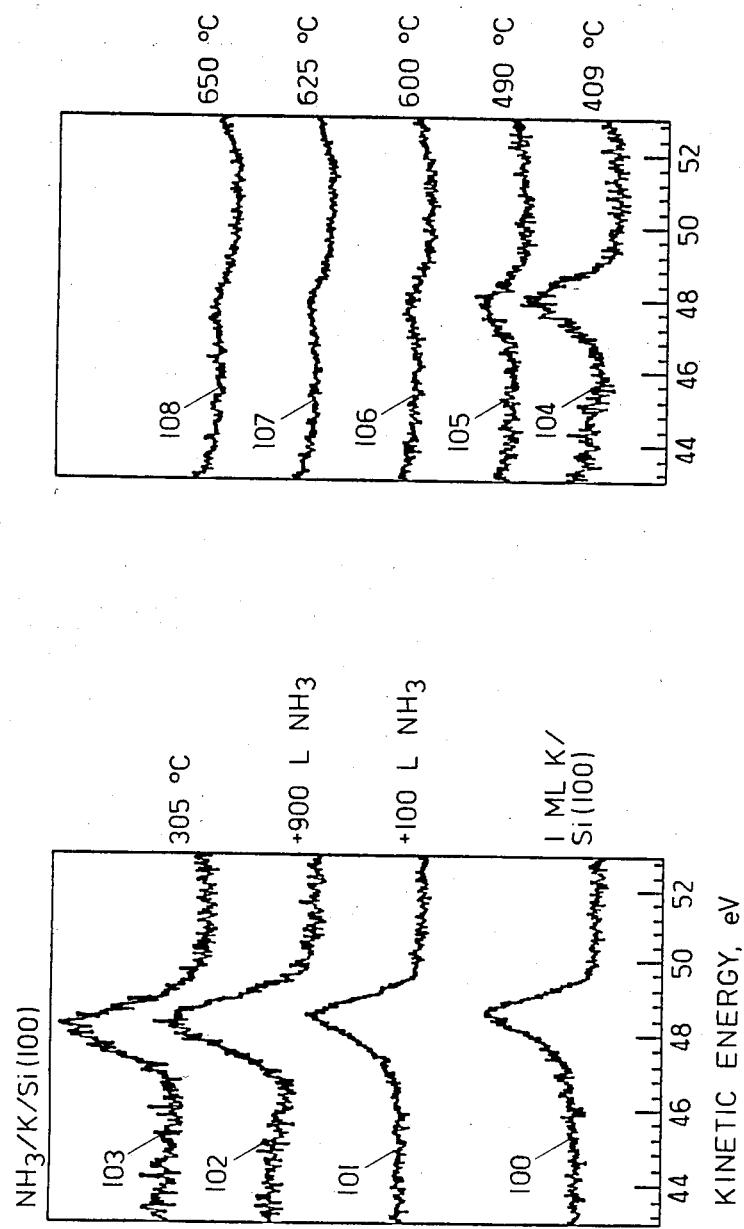
FIGS. 10 and 11 are composite photoemission spectra using synchrotron radiation at an incident photon energy of 77 eV of the potassium 3p core level of the surface as in FIGS. 8 and 9, after a monolayer of potassium is deposited thereon, after exposure of the surface to 100 Langmuir ammonia gas, after exposure to 900 Langmuir ammonia gas, and after heat treatment of the surface with the potassium deposited thereon at various temperature steps from 305° C. to 650° C. Photoelectron intensity is normalized to the beam current.

The graphs of FIGS. 10 and 11 show the photoemission spectra of the potassium 3p core levels as the substrate was heated to progressively higher temperatures. The graph 100 shows the spectrum after application of the monolayer of potassium to the silicon substrate. The graph 101 shows the spectra after exposure to 100 Langmuir of ammonia gas and the graph 102 after exposure to 900 Langmuir of ammonia gas. The graphs 103 through 108 show the spectra obtained as the sample was heated from 305° C. to 650° C. As demonstrated in these spectra, the potassium peak diminishes and substantially disappears as the sample was heated to the 650° C. level.

The thickness of the nitride layer formed is controlled by the nitrogen exposure made, allowing selection of either very thin layers less than 10 Angstroms in thickness or very thick layers, as desired. In addition to the alkali metals described above in the examples, the other alkali metals, rubidium and lithium, may also be employed for catalyzation of nitride formation although these metals are apparently less efficient than sodium, potassium and cesium as catalysts of nitridation for semiconductors. Sodium, potassium and cesium are preferred where the catalyst is to be removed from the nitrided substrate at relatively low temperatures. Lithium in particular tends to bond strongly to various substrates and may interdiffuse into certain substrates, but may be utilized where removal of the lithium is not critical. It may also be noted that it is not generally possible at room temperature to deposit more than one monolayer of cesium or rubidium in the manner described above, but sodium and potassium can be deposited in more than a monolayer. However, additional layers of alkali metals can be deposited by cooling the sample, for example to $-100°$ C. to $-180°$ C. The thickness of the catalyst layer generally affects the thickness of the resulting nitride at a particular nitrogen exposure level, with a minimum catalyst thickness of approximately 0.5 monolayer generally being required.

The foregoing catalytic nitridation processes may also be used on other semiconductors such as polycrystalline silicon, germanium, gallium arsenide, indium phosphide, and other III-V semiconductors, to other silicon crystal faces, and so forth. The following example shows the utilization of the present process a III-V semiconductor, indium phosphide.

EXAMPLE 5

Figure 12:
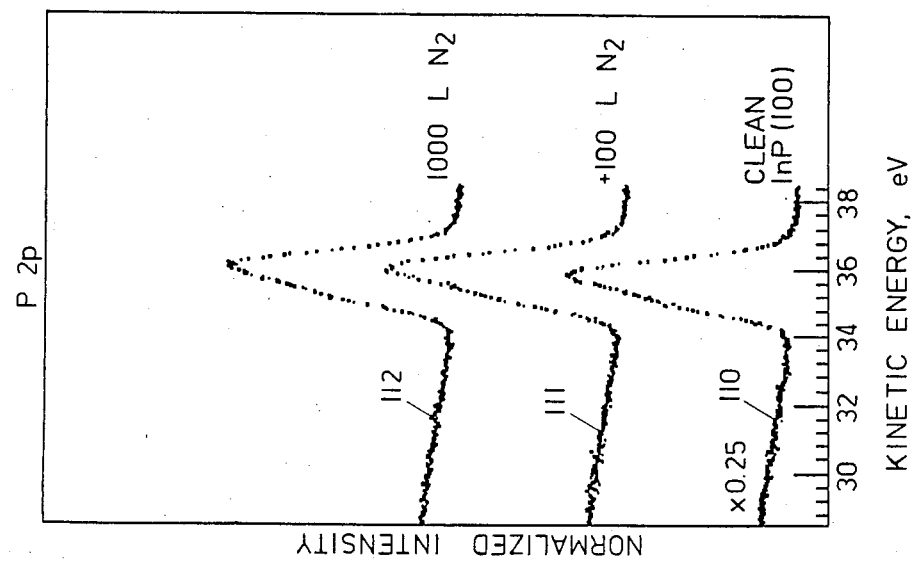

A nitride layer was formed on an indium phosphide (110) sample using potassium as the catalyst. The indium phosphide sample was mounted in an ultra-high vacuum chamber and cleaved to obtain a mirror-like surface, and a potassium chromate source was mounted and outgassed as described above for the sodium source. After outgassing, the source was brought to about 1 centimeter from the indium phosphide sample and one monolayer of potassium was formed by deposition on the indium phosphide substrate. However, before the potassium layer was deposited on the substrate, photoemission spectra were taken of the initial clean substrate, shown by the graph 110 in FIG. 12, the substrate after exposure of the clean substrate to 100 Langmuir of nitrogen, resulting in the photoemission spectrum shown by the graph 111, and the substrate after exposure to 1000 Langmuir nitrogen, resulting in the photoemission spectrum shown by the graph 112 in FIG. 12. As illustrated in these graphs, there is no detectable formation of nitride on the indium phosphide surface.

Figure 13:
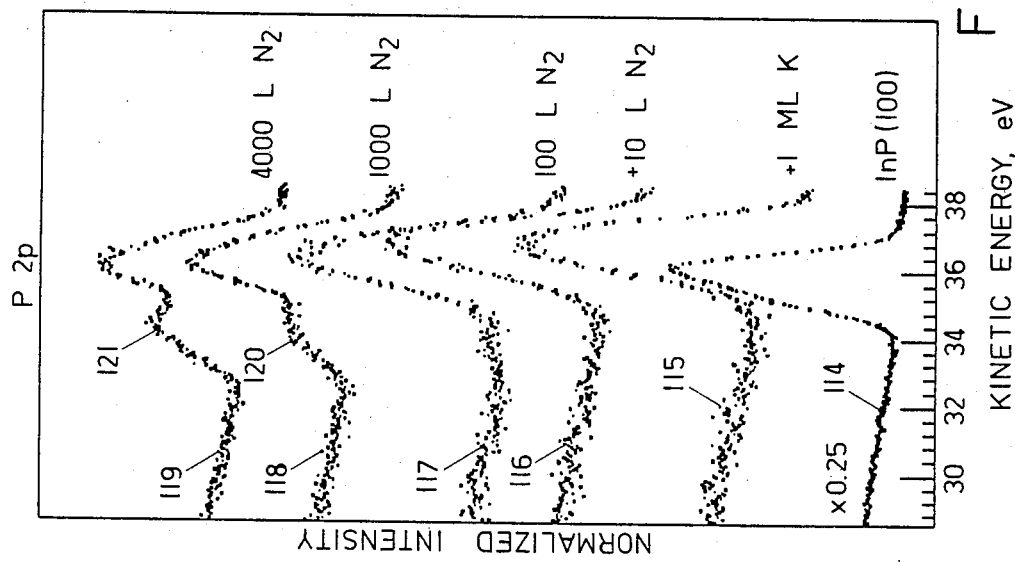
FIGS. 12 and 13 are composite photoemission spectra using synchrotron radiation at an incident photon energy of 170 eV of the phosphorus 2p core level of an indium phosphide (110) surface, after exposure to nitrogen gas without a catalyst, after a monolayer of potassium is deposited thereon, and after exposure to nitrogen gas at levels from 10 to 4000 Langmuir.

The photoemission spectra of FIG. 13 illustrate the effect of the potassium catalyst layer. The graph labeled 114 in FIG. 13 is the photoemission spectrum of the clean indium phosphide substrate surface and the graph 115 is the spectrum after application of one monolayer of potassium. The graphs labeled 116 to 119 are the spectra of the substrate with the one monolayer of potassium catalyst at nitrogen gas exposure levels from 10 Langmuir to 4000 Langmuir. As shown in FIG. 13, at an exposure level of 1000 Langmuir, a distinct second peak 120 is formed which shows up as the enhanced peak 121 and in the spectrum 119 at an exposure level of 4000 Langmuir. Each of the exposures to nitrogen gas were made at room temperature. These data indicate that nitridation of the indium phosphide is occuring at room temperatures and at nitrogen exposure levels at which no nitridation occurs without the catalyst.

Alkali sources other than chromate sources may be utilized. A variety of other techniques and apparatus for the heating and temperature control of the substrate are available, as well known in the art, and may be utilized as desired in carrying out the invention. As discussed above, a salient advantage of the present invention is that the alkali metal catalyst desorbs completely from the nitride layer at relatively moderate elevated temperatures, temperatures much lower than the typical 1,000° C. or higher temperatures that have previously been required to form nitrides on semiconductor substrates such as silicon. It is important that the alkali metal catalyst be essentially eliminated from the nitride layer or bulk since the presence of the alkali metal ions could seriously interfere with the formation of microelectronic devices on the substrates. However, not only does the alkali metal catalyst desorb from the nitride layer, it also does not diffuse into the bulk of the semiconductor substrate since the forming silicon nitride layer is a very effective alkali ion diffusion barrier.

It is understood that the invention is not confined to the particular embodiments set forth herein as illustrative, but embraces such modified forms thereof as come within the scope of the following claims.

What is claimed is:

1. A method of forming a nitride layer on a silicon substrate comprising the steps of:
   (a) depositing a thin layer of an alkali metal on a surface of the silicon substrate; and
   (b) providing nitrogen from a nitrogen source to the surface at a temperature and nitrogen pressure sufficient for formation of a nitride of the silicon at the surface by catalytic action of the alkali metal to a desired nitride thickness.

2. The method of claim 1 wherein the alkali metal is sodium.

3. The method of claim 1 wherein the alkali metal is selected from the group consisting of sodium, potassium, cesium and rubidium.

4. The method of claim 1 wherein the alkali metal is deposited in approximately a monolayer.

5. The method of claim 3 including the additional step of heating the substrate and nitride layer thereon to desorb substantially all of the alkali metal catalyst and to convert the nitride layer to higher nitridation states.

6. The method of claim 2 including the additional step of heating the substrate and nitride layer thereon to desorb substantially all of the sodium catalyst and to convert the nitride layer to higher nitridation states.

7. The method of claim 6 wherein the step of heating the substrate is performed at a temperature not greater than approximately 650° C.

8. The method of claim 1 wherein the nitrogen source is molecular nitrogen gas.

9. The method of claim 1 wherein the nitrogen source is ammonia gas.

10. A method of forming a nitride layer on a semiconductor surface which is capable of forming nitrides, comprising the steps of:
   (a) depositing a thin layer of an alkali metal onto a surface of the substrate;
   (b) providing nitrogen from a nitrogen source to the surface at a temperature and nitrogen pressure sufficient for formation of a nitride of the substrate at the surface by catalytic action of the alkali metal to a desired nitride thickness; and
   (c) heating the substrate to desorb substantially all of the alkali metal catalyst from the substrate and the nitride layer thereon.

11. The method of claim 10 wherein the substrate is selected from the group consisting of silicon, germanium, gallium arsenide, and indium phosphide.

12. The method of claim 10 wherein the alkali metal is sodium and the semiconductor substrate is silicon.

13. The method of claim 12 wherein the step of heating the substrate is done at a temperature not greater than approximately 650° C.

14. The method of claim 10 wherein the semiconductor substrate is silicon and the alkali metal is cesium.

15. The method of claim 14 wherein the step of heating the substrate is done at a temperature not greater than approximately 800° C.

16. The method of claim 10 wherein the alkali metal is deposited in approximately a monolayer.

17. The method of claim 10 wherein the step of providing nitrogen to the surface is done at approximately room temperature.

18. The method of claim 10 wherein the nitrogen source is molecular nitrogen gas.

19. The method of claim 10 wherein the nitrogen source is ammonia gas.

20. A silicon substrate with a nitride layer formed thereon by the method of claim 1.

21. A silicon substrate with a nitride layer formed thereon by the method of claim 6.

22. A semiconductor substrate with a nitride layer formed thereon by the method of claim 10.

23. A semiconductor substrate with a nitride layer formed thereon by the method of claim 11.

* * * * *